US009876483B2

United States Patent
Ortiz et al.

(10) Patent No.: US 9,876,483 B2
(45) Date of Patent: Jan. 23, 2018

(54) ACOUSTIC RESONATOR DEVICE INCLUDING TRENCH FOR PROVIDING STRESS RELIEF

(71) Applicant: Avago Technologies General IP (Singapore) Pte. Ltd., Singapore (SG)

(72) Inventors: Steven M. Ortiz, Fort Collins, CO (US); Suresh Sridaran, Fort Collins, CO (US); Frank Bi, Fort Collins, CO (US); Martha K. Small, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 343 days.

(21) Appl. No.: 14/229,205

(22) Filed: Mar. 28, 2014

(65) Prior Publication Data

US 2015/0280688 A1 Oct. 1, 2015

(51) Int. Cl.
*H01L 41/053* (2006.01)
*H03H 9/25* (2006.01)
*H03H 9/17* (2006.01)
*H03H 9/10* (2006.01)

(52) U.S. Cl.
CPC ............ *H03H 9/25* (2013.01); *H01L 41/053* (2013.01); *H03H 9/1014* (2013.01); *H03H 9/17* (2013.01); *H03H 9/173* (2013.01)

(58) Field of Classification Search
CPC .............. H01L 41/053; H03H 9/02535; H03H 9/02007; H03H 9/02047; H03H 9/02614
USPC ...... 310/313 R, 313 A, 313 B, 313 C, 313 D, 310/321, 340, 344, 348
See application file for complete search history.

(56) References Cited

U.S. PATENT DOCUMENTS

| | | |
|---|---|---|
| 5,587,620 A | 12/1996 | Ruby et al. |
| 5,684,437 A * | 11/1997 | Ago ................. H03H 9/02653 310/313 R |
| 5,873,153 A | 2/1999 | Ruby et al. |
| 6,107,721 A | 8/2000 | Lakin |
| 6,300,223 B1 | 10/2001 | Chang et al. |
| 6,384,697 B1 | 5/2002 | Ruby |
| 6,507,983 B1 | 1/2003 | Ruby et al. |
| 6,548,943 B2 | 4/2003 | Kaitila et al. |
| 6,936,837 B2 | 8/2005 | Yamada et al. |
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson et al. |
| 7,388,454 B2 | 6/2008 | Ruby et al. |
| 7,629,865 B2 | 12/2009 | Ruby |

(Continued)

OTHER PUBLICATIONS

Ranjan et al. "Strained Hexagonal ScN: A Material with Unusual Structural and Optical Properties," Physical Review Letters, Jun. 27, 2003, vol. 90, No. 25, The American Physical Society, USA.
Farrer et al., "Properties of hexagonal ScN versus wurtzite GaN and InN," Physical Review B, Nov. 20, 2002, vol. 66, No. 20, The American Physical Society, USA.
Constantin et al., "Composition-dependent structural properties in ScGaN alloy films: A combined experimental and theoretical study," Journal of Applied Physics, Dec. 16, 2005, vol. 98, No. 12, American Institute of Physics, USA.

(Continued)

*Primary Examiner* — Derek Rosenau

(57) ABSTRACT

An microelectronic device includes a substrate, a piezoelectric component formed over the substrate, at least one trench formed in the substrate. The piezoelectric component has a corresponding resonance frequency. The at least one trench is configured to reduce mechanical stress on the piezoelectric component, in response to force applied to the substrate, for stabilizing the resonance frequency.

24 Claims, 6 Drawing Sheets

(56) References Cited

U.S. PATENT DOCUMENTS

| | | |
|---|---|---|
| 7,758,979 B2 | 7/2010 | Akiyama et al. |
| 2004/0029356 A1* | 2/2004 | Timme ............ H03H 3/02 438/455 |
| 2005/0142888 A1* | 6/2005 | Ebuchi ............ H03H 3/02 438/738 |
| 2006/0131731 A1* | 6/2006 | Sato ............ B81B 7/007 257/704 |
| 2007/0057597 A1* | 3/2007 | Aoki ............ H03H 9/1092 310/313 B |
| 2007/0096605 A1* | 5/2007 | Fujii ............ H03H 3/02 310/348 |
| 2007/0205850 A1 | 9/2007 | Jamneala et al. |
| 2008/0258842 A1 | 10/2008 | Ruby et al. |
| 2009/0200159 A1 | 8/2009 | Suzuki et al. |
| 2010/0314969 A1 | 12/2010 | Gaidarzhy et al. |
| 2010/0327697 A1 | 12/2010 | Choy et al. |
| 2010/0327994 A1 | 12/2010 | Choy et al. |
| 2012/0043859 A1* | 2/2012 | Ichikawa ............ H03H 3/02 310/344 |
| 2012/0074818 A1* | 3/2012 | Crowley ............ G01C 19/5769 310/348 |
| 2012/0280758 A1 | 11/2012 | Jaakkola et al. |
| 2013/0049543 A1* | 2/2013 | Amano ............ H03H 9/0595 310/344 |
| 2014/0246305 A1* | 9/2014 | Larson, III ............ C23C 14/022 204/192.18 |

OTHER PUBLICATIONS

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

Co-pending U.S. Appl. No. 13/662,460, filed Oct. 27, 2012.
Co-pending U.S. Appl. No. 13/662,425, filed Oct. 27, 2012.
Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Feb. 28, 2011.
Co-pending U.S. Appl. No. 13/654,718, filed Oct. 18, 2012.

"Insights From Leading Edge", Solid State Technology, Insights for Electronics Manufacturing, 2014, http://electroiq.com/insights-from-leading-edge/author/insights-from-leading-edge/page/15/, pp. 1-32.

\* cited by examiner

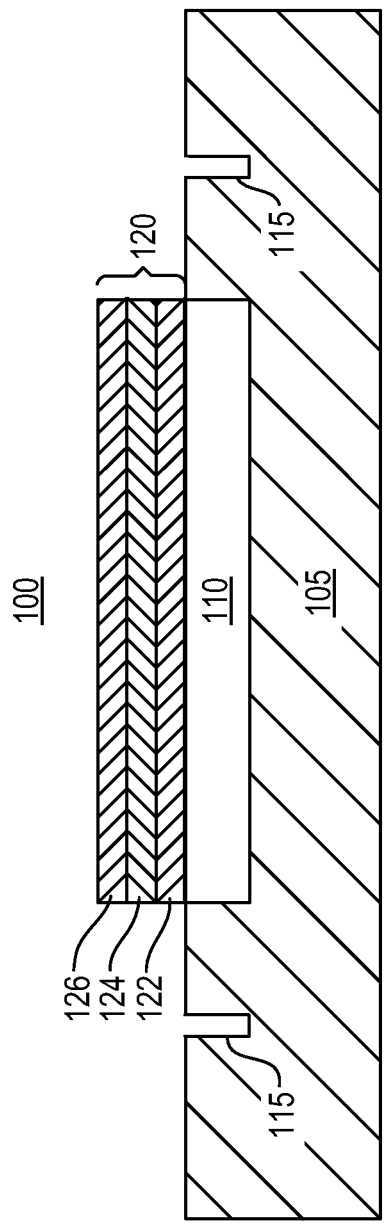
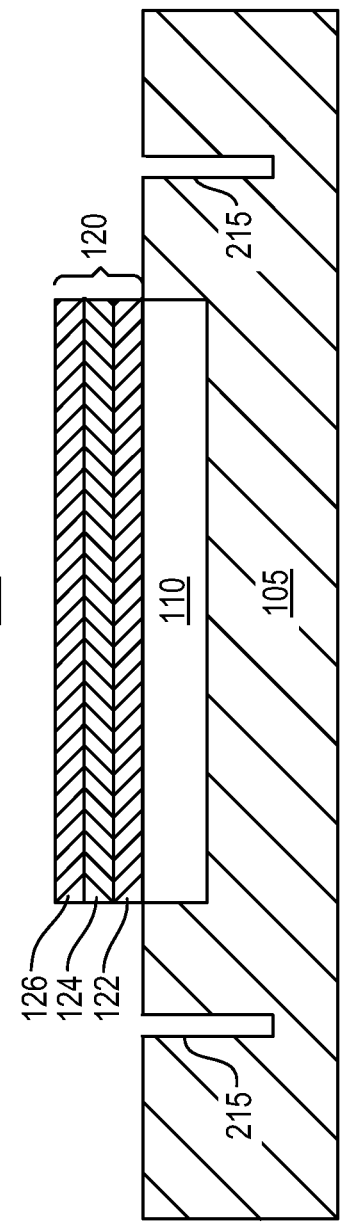

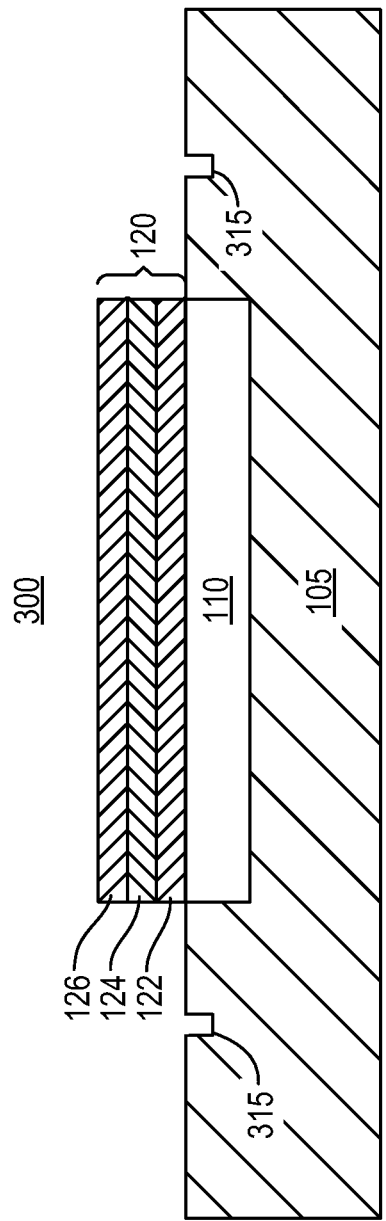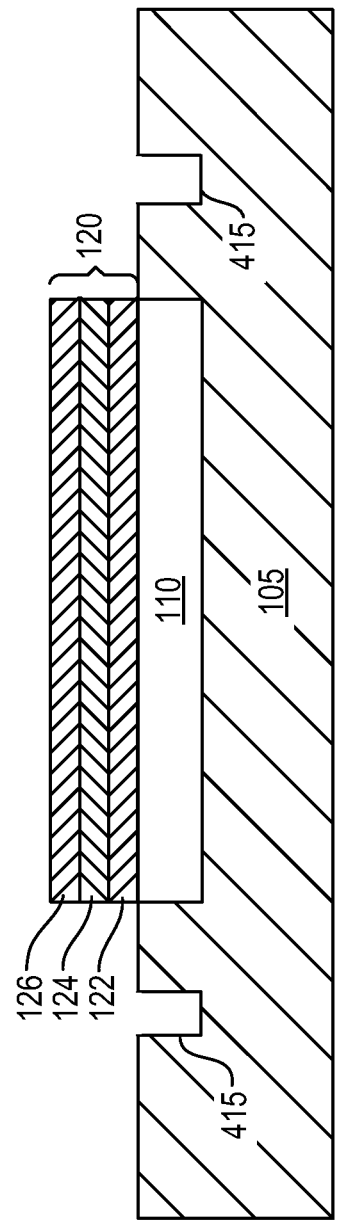

ACOUSTIC RESONATOR DEVICE INCLUDING TRENCH FOR PROVIDING STRESS RELIEF

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including surface acoustic wave resonators (SAW) and bulk acoustic wave (BAW) resonators, such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a bottom (first) electrode and a top (second) electrode over a cavity. BAW resonators may be used in a wide variety of electronic applications, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract (oscillate) depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonance frequency of the piezoelectric layer being determined by factors such as the materials, dimensions, and operating conditions of the acoustic stack. These and other mechanical characteristics of the acoustic resonator determine its frequency response.

As indicated above, acoustic resonators (and other microelectronic devices including piezoelectric components) are typically applied to a substrate or wafer, and may ultimately be incorporate into a packaged unit. The substrate in particular may be subjected to external or internal forces that cause flexing or bending of the substrate and/or other portions of the package unit. For example, the different materials used to form the substrate and the electrical contacts or other components may have different temperature expansion and contraction characteristics, resulting in different rates of expansion and contraction in response to temperature changes, resulting in forces that may bend the substrate, resulting in various mechanical stresses on the acoustic resonators (or other microelectronic devices including piezoelectric components). The mechanical stresses, in turn, may cause undesirable operational changes (such as changes to resonance frequency) and/or physical changes (such as cracking or weakening of piezoelectric material). Accordingly, there is a need for providing stress relief for microelectronic devices subject to force induced stresses.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1 is a cross-sectional view of an acoustic resonator device having a trench in a substrate, according to a representative embodiment.

FIG. 2 is a cross-sectional view of an acoustic resonator device having a trench in a substrate, according to a representative embodiment.

FIG. 3 is a cross-sectional view of an acoustic resonator device having a trench in a substrate, according to a representative embodiment.

FIG. 4 is a cross-sectional view of an acoustic resonator device having a trench in a substrate, according to a representative embodiment.

DETAILED DESCRIPTION

Figure 5:
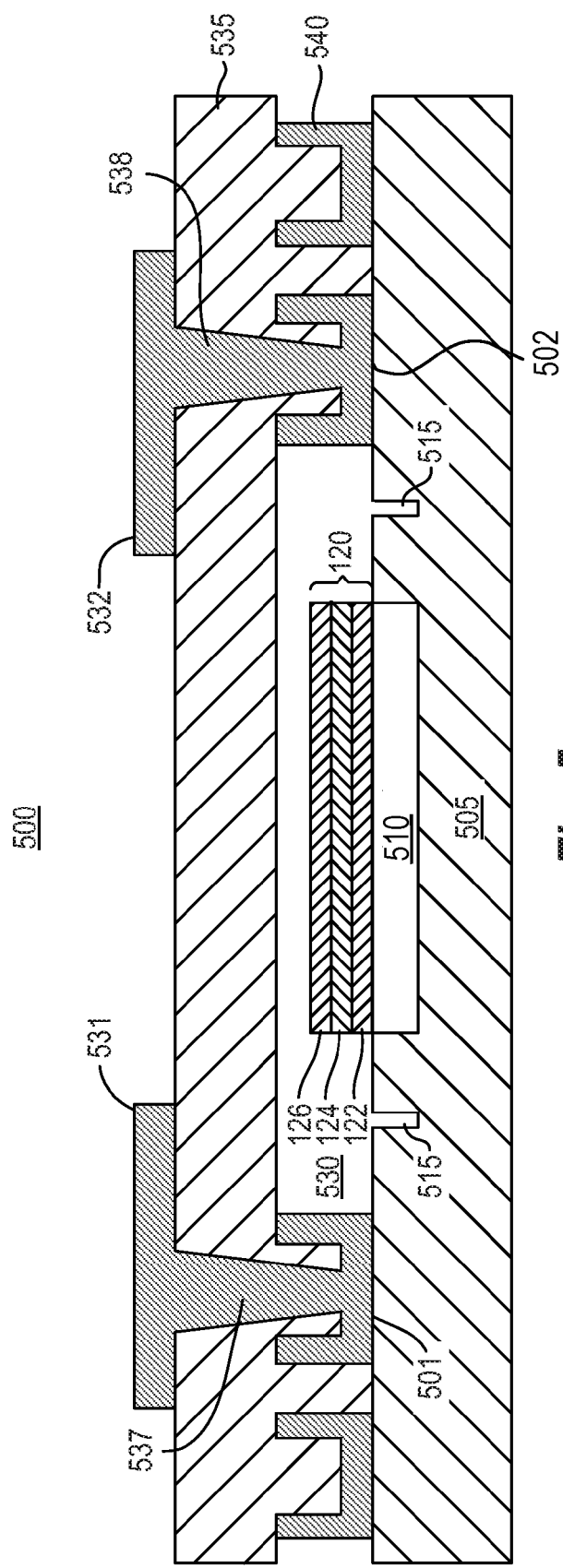
FIG. 5 is a cross-sectional view of an integrated circuit (IC) device including an acoustic resonator device having at least trench in a base substrate, according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al. (issued as U.S. Pat. No. 9,385,684 on Jul. 5, 2016); U.S. patent application Ser. No. 13/663,449 to Burak et al. (issued as U.S. Pat. No. 9,401,692 on Jul. 26, 2016); U.S. patent application Ser. No. 13/660,941 to Burak et al. (issued as U.S. Pat. No. 9,425,764 on Aug. 23, 2016); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

Generally, according to various embodiments, one or more trenches are formed in a substrate of a microelectronic device, such as an acoustic resonator device, to reduce or prevent stress applied to stress sensitive components of the microelectronic device, such as piezoelectric components having corresponding resonance frequencies. Stress often occurs, for example, from materials having different rates of thermal expansion and contraction being exposed to changes in temperature, such as high temperature soldering and subsequent cooling during fabrication, and/or changes in ambient and internal temperatures during device operations, for example. Etching of the one or more trenches (or portions of trenches) around a stress sensitive component is performed so that forces applied to microelectronic device will not be transmitted in the form of mechanical stress to isolated regions. The various embodiments may be applied to any microelectronic devices having stress sensitive components (such as piezoelectric components), including BAW resonators, such as FBARs and SMRs, as well as other types of acoustic resonators, such as SAW resonators and Rayleigh resonators, for example.

FIG. 1 is a cross-sectional view of an acoustic resonator device, in accordance with a representative embodiment.

Referring to FIG. 1, acoustic resonator device 100 includes a substrate 105, which defines a cavity 110 (e.g., air cavity) enabling acoustic reflection, and an acoustic resonator 120 formed on the substrate 105 over the cavity 110. The acoustic resonator 120 includes a bottom electrode 122 formed on the substrate 105 over the cavity 110, a piezoelectric layer 124 formed on the substrate 105 and the bottom electrode 122, and a top electrode 126 formed on the piezoelectric layer 124. Overlapping portions of the bottom electrode 122, the piezoelectric layer 124 and the top electrode 126 form an acoustic stack and otherwise define an active area of the acoustic resonator 120. The piezoelectric layer 124 is configured to have a corresponding resonance frequency at which it oscillates when voltage is applied across the bottom and top electrode 122 and 126. A passivation layer (not shown) may be disposed on a top surface of the top electrode 126 (and exposed portions of a top surface of the piezoelectric layer 124), where the passivation layer has a thickness sufficient to insulate all layers of the acoustic stack from the environment, including protection from moisture, corrosives, contaminants, debris and the like.

Notably, the acoustic resonator device 100 is depicted and discussed herein for purposes of illustration, as it is an example of a microelectronic device having a piezoelectric layer (e.g., piezoelectric layer 124 of acoustic resonator 120). It is understood, however, that the various embodiment discussed herein may apply to other types of microelectronic devices having a piezoelectric component (such as a piezoelectric layer) having a resonance frequency which may be disrupted by mechanical stresses.

In addition, the acoustic resonator device 100 includes trench 115 formed in the 105 substrate. In the depicted embodiment, the trench 115 is formed outside an outer perimeter of the acoustic resonator 120. Also, in the depicted embodiment, it is assumed for purposes of illustration that the trench 115 is a single trench forming a continuous loop (e.g., surrounding the cavity 110). However, in alternative embodiments, the trench 115 may form only a partial loop (e.g., surrounding a portion of the cavity 110). In this case, the trench 115 would comprises one or more trench portions (not shown) which are separately formed in the substrate 105. For example, the left portion of the trench 115 may extend in a straight line, e.g., in a direction perpendicular to the cross-sectional face of the acoustic resonator device 100 adjacent the left side of the cavity 110, or curve around only a portion of the left side of the cavity 110. Likewise, the right portion of the trench 115 may extend in a straight line, e.g., in a direction perpendicular to the cross-sectional face of the acoustic resonator device 100 adjacent the right side of the cavity 110, or curve around only a portion of the right side of the cavity 110. In this case, portions of the substrate 105 would separate corresponding portions of the trench 115. Regardless, it is understood that the number of trenches and/or trench portions may vary, to provide unique benefits for any particular situation or to meet application specific design requirements of various implementations, without departing from the scope of the present teachings.

The substrate 105 may be formed of a material compatible with semiconductor processes, such as silicon (Si), gallium arsenide (GaAs), indium phosphide (InP), glass, sapphire, alumina, or the like, for example. The cavity 110 and the trench 115 may be formed by etching the substrate 105 through an etch mask, and filling the etched cavity 110 and trench 115 with a sacrificial material, such as phosphosilicate glass (PSG), for example, which is subsequently released to leave respective air spaces. An advantage of the cavity 110 and the trench 115 being the same depth is that both may be formed in a single masking and etching step. In contrast, when the cavity 110 and the trench 115 are different depths, as discussed below with reference to FIGS. 2 and 3, for example, multiple masking and etching steps must be performed, as would be apparent to one of ordinary skill in the art. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 122 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the bottom electrode 122 may be formed of two or more layers of electrically conductive materials, which may by the same as or different from one another. Likewise, the top electrode 126 may be formed of electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the top electrode 126 may be formed of two or more layers of electrically conductive materials, which may by the same as or different from one another. Also, the configuration and/or the material(s) forming the top electrode 126 may be the same as or different from the configuration and/or the material(s) forming the bottom electrode 122.

The piezoelectric layer 124 may be formed of any piezoelectric material compatible with semiconductor processes, such as aluminum nitride (AlN), zinc oxide (ZnO), or zirconate titanate (PZT), for example. Also, in various embodiments, piezoelectric layer 124 may be "doped" with another element, such as one or more rare earth elements (e.g., scandium (Sc), yttrium (Y), lanthanum (La), or erbium (Er)), for example, to improve the piezoelectric coupling coefficient $e_{33}$ and/or electromechanical coupling coefficient $Kt^2$ in the piezoelectric layer 124. Examples of doping piezoelectric layers with one or more rare earth elements are provided by U.S. patent application Ser. No. 13/662,425 (filed Oct. 27, 2012), to Bradley et al. (issued as U.S. Pat. No. 9,225,313 on Dec. 15, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Of course, other materials may be incorporated into the above and other features of the acoustic resonator device 100 (as well as the other acoustic resonator device described herein) without departing from the scope of the present teachings.

Generally, the trench 115 is configured to reduce mechanical stress on the acoustic resonator 120, and more particularly, on the piezoelectric layer 124, in response to one or more forces applied to the substrate 105, thereby stabilizing the resonance frequency of the piezoelectric layer 124 and/or the acoustic resonator device 100. For example, the forces applied to the substrate 105 may result from an external application of pressure (e.g., bending or twisting) to one or more portions of the substrate 105, causing the substrate 105 to flex downward (applying tensile stress to the acoustic resonator 120) or to flex upward (applying compressive stress to the acoustic resonator 120). As another example, the forces applied to the substrate 105 may result from internal application pressure, such as pressure caused by different temperature expansion and contraction characteristics of the material forming the substrate 105 and material(s) of other components to with the substrate 105 and/or the acoustic resonator 120 are attached. For example, as discussed below with reference to FIGS. 5 and 6, the acoustic resonator device 100 may be included in an integrated circuit (IC) package, such that metal contacts enabling electrical connection to the bottom and top electrodes 122 and 126 are formed on a top surface of the substrate 105. Because the temperature expansion and contraction characteristics of the metal contacts differ from those of the semiconductor (e.g., dielectric) material of the substrate 105, the difference rates of expansion and contraction of the contacts may likewise cause the substrate 105 to flex downward (applying tensile stress to the acoustic resonator 120) or to flex upward (applying compressive stress to the acoustic resonator 120).

To eliminate or reduce such stresses, the trench 115 is configured to expand (open up) at the surface of the substrate 105 in response to downward flexing of the substrate 105, and contract (close in) at the surface of the substrate 105 in response to upward flexing of the substrate 105. This enables the acoustic resonator 120 to remain relatively flat, or at least to bend less, in response to the pressures on the substrate 105, thereby reducing mechanical stress incurred by the acoustic resonator 120, as mentioned above.

Notably, FIG. 1 depicts an FBAR due to the presence of the cavity 110. However, it is understood that the trench 115 may be included in various other types of resonator devices, without departing from the scope of the present teachings. For example, in place of a cavity (110), an acoustic resonator device with one or more trenches may be an SMR including an acoustic mirror, such as a distributed Bragg reflector (DBR), as the acoustic reflector. The acoustic mirror may include multiple pairs of acoustic reflector layers sequentially stacked on a top surface of the substrate, where each pair includes first low acoustic impedance layer formed of low acoustic impedance material stacked on first high acoustic impedance layer formed of high acoustic impedance material, as would be apparent to one of ordinary skill in the art. In this alternative embodiment, one or more trenches (115) may be formed in the substrate (105) around an outer perimeter of the acoustic mirror, thereby reducing mechanical stress on the acoustic resonator (120), the corresponding piezoelectric layer (124), as well as the acoustic mirror, in response to one or more forces applied to the substrate. Again, the reduction of stress stabilizes the resonance frequency of the piezoelectric layer and/or the acoustic resonator device. Various illustrative fabrication techniques of acoustic mirrors are described by in U.S. Pat. No. 7,358,831 (Apr. 15, 2008), to Larson III, et al., which is hereby incorporated by reference in its entirety.

In various embodiments, the depth and/or width of the trench may be varied to obtain different results. Generally, for example, the amount of tensile stress incurred by an acoustic resonator is inversely proportional to a trench depth of the at least one trench (e.g., configured to reduce tensile stress on the acoustic resonator in response to a downward flexing force applied to the substrate). Similarly, for example, an amount of compressive stress incurred by an acoustic resonator is inversely proportional to a trench width of the at least one trench (e.g., configured to reduce compressive stress on the acoustic resonator in response to an upward flexing force applied to the substrate). FIGS. 2 and 3 are cross-sectional views of acoustic resonator devices having longer and shorter trenches in the corresponding substrates, according to representative embodiments. FIG. 4 is a cross-sectional view of an acoustic resonator device having a wider trench in the substrate, according to representative embodiments.

Referring to FIG. 2, acoustic resonator device 200 is substantially the same as the acoustic resonator device 100 shown in FIG. 1, except that trench 215 is deeper than trench 115. That is, the acoustic resonator device 200 includes the substrate 105, the cavity 110, and the acoustic resonator 120 formed on the substrate 105 over the cavity 110. Referring to FIG. 3, acoustic resonator device 300 is substantially the same as the acoustic resonator device 100 shown in FIG. 1, except that trench 315 is shallower than trench 115. That is, the acoustic resonator device 300 includes the substrate 105, the cavity 110, and the acoustic resonator 120 formed on the substrate 105 over the cavity 110. However, a trench depth of the trench 215 is greater than a cavity depth of the cavity 110. The details of the acoustic resonator 120 are the same as described above with reference to FIG. 1, and therefore will not be repeated with reference to FIGS. 2 and 3.

The deeper trench 215 in FIG. 2 provides more flexibility to the substrate 105 in response application of mechanical pressure tending to flex the substrate 105 downward, which further reduces (tensile) stress on the acoustic resonator 120 as compared to the stress reduction provided by the trench 115. However, the substrate 105 is less structurally sound due to the removal of a larger amount of material from the substrate 105 when etching the trench 215, as compared to the trench 115. In contrast, the shallower trench 315 in FIG. 3 provides less flexibility to the substrate 105 in response application of mechanical pressure, which increases (tensile) stress on the acoustic resonator 120 as compared to the stress reduction provided by the trench 115, although the stress on the acoustic resonator 120 is still less than a configuration in which the substrate 105 has no trench. The substrate 105 with the trench 315 is more structurally sound than the substrate 105 with the trench 115 (or the trench 215) due to the removal of a smaller amount of material from the substrate 105 when etching the trench 315, as compared to the trench 115.

The respective depths of the trenches (115, 215, 315) may vary, to provide unique benefits for any particular situation or to meet application specific design requirements of various implementations, without departing from the scope of the present teachings. For example, assuming that the substrate 105 is approximately 100 μm thick, the trench 115 may be approximately 2 μm deep, the trench 215 may be approximately 25 μm deep, and the trench 315 may be approximately 1 μm deep. Referring to FIG. 1, it is apparent that the cavity 110 is also approximately 2 μm deep (i.e., about the same depth as the trench 115). Therefore, as can been seen in FIGS. 2 and 3, respectively, the trench 215 extends longer into the substrate 105 than the cavity 110, while the trench 315 extends shorter into the substrate 105 than the cavity 110. In various embodiments, where the trenches (115, 215, 315) are discontinuous, and thus are formed of multiple trench portions, as discussed above, the multiple trench portions may have the same or different lengths (and widths), without departing from the scope of the present teachings.

Referring to FIG. 4, acoustic resonator device 400 is substantially the same as the acoustic resonator device 100 shown in FIG. 1, except that trench 415 is wider than trench 115. That is, the acoustic resonator device 400 includes the substrate 105, the cavity 110, and the acoustic resonator 120 formed on the substrate 105 over the cavity 110. The details of the acoustic resonator 120 are the same as described above with reference to FIG. 1, and therefore will not be repeated with reference to FIG. 4.

The wider trench 415 in FIG. 4 provides more flexibility to the substrate 105 in response application of mechanical pressure tending to flex the substrate 105 upward, which further reduces (compressive tensile) stress on the acoustic resonator 120 as compared to the stress reduction provided by the trench 115. However, the substrate 105 is less structurally sound due to the larger amount of material removed from the substrate 105 in order to etch the trench 415, as compared to the trench 115.

The respective widths of the trenches (115, 415) may vary, to provide unique benefits for any particular situation or to meet application specific design requirements of various implementations, without departing from the scope of the present teachings. For example, again assuming that the substrate 105 is approximately 100 μm thick, the trench 115 may be approximately 7.0 μm wide, and the trench 415 may be approximately 12 μm wide. In various embodiments, where the trenches (115, 415) are discontinuous, and thus are formed of multiple trench portions, as discussed above, the multiple trench portions may have the same or different widths (and lengths), without departing from the scope of the present teachings.

In various embodiments, acoustic resonator devices having trenches may be incorporated into circuits or otherwise packaged, e.g., into integrated circuit (IC) devices. FIG. 5 is a cross-sectional view of a packaged IC device including an acoustic resonator device having at least one trench in a base substrate, according to a representative embodiment.

Referring to FIG. 5, packaged IC circuit 500 includes acoustic resonator 120 formed on a base substrate 505, which defines a cavity 510 (e.g., air cavity) enabling acoustic reflection, assembled using flip-chip technology, for example. In addition, trench 515 is formed in the substrate 505 outside an outer perimeter of the acoustic resonator 120 and corresponding piezoelectric layer 124. In the depicted embodiment, trench 515 is substantially the same depth as the cavity 510, although in various alternative embodiments, the trench 515 may extend deeper or shallower into the substrate 505, or may be wider or narrower, as discussed above with reference to FIGS. 2 to 4, without departing from the scope of the present teachings. Also, it is assumed for purposes of illustration that the trench 515 is a single trench forming a continuous loop (around the cavity 110). However, in alternative embodiments, the trench 515 may comprise one or more trench portions that curve around only portions of the cavity 510, forming only a partial loop, or that extend in a straight line, e.g., in a direction perpendicular to the cross-sectional face of the packaged IC circuit 500, as discussed above with reference to FIG. 1.

The packaged IC circuit 500 further includes a lid substrate 535 positioned over the acoustic resonator 120 and defining a lid cavity 530 between the base substrate 505 and the lid substrate 535. The acoustic resonator 120 is positioned within the lid cavity 530. The lid substrate 535 is connected and sealed to the base substrate 505 by seal ring 540 formed between the lid substrate 535 and the base substrate 505 around an outer perimeter of the packaged IC circuit 500. The seal ring 540 forms an outer boundary of the lid cavity 530.

Circuitry of the base substrate 505, including the acoustic resonator 120, is electronically connected to circuitry of the lid substrate 535. That is, in the depicted embodiment, first base contact 501 is disposed on the base substrate 505 and is electrically connected to one of the bottom electrode 122 or the top electrode 126 of the acoustic resonator 120, and a second base contact 502 is disposed on the base substrate 505 and electrically connected to the other one of bottom electrode 122 or the top electrode 126 of the acoustic resonator 120. Application of voltage across the bottom and top electrodes 122 and 126 via the first and second base contacts 501 and 502 causes the piezoelectric layer 124 to oscillate at a corresponding resonance frequency, as discussed above.

Also in the depicted embodiment, circuitry of the lid substrate 535 includes first lid pad 531 and second lid pad 532 disposed on the lid substrate 535. The first lid pad 531 may be electrically connected to the first base contact 501 through first via 537, and the second lid pad 532 may be electrically connected to the second base contact 502 through second via 538, for example.

Each of the base substrate 505 and the lid substrate 535 may be formed of a material compatible with semiconductor processes, such as silicon (Si), gallium arsenide (GaAs), indium phosphide (InP), glass, sapphire, alumina, or the like, for example. The cavity 510 and the trench 515 may be formed by etching the substrate 105 through an etch mask, and filling the etched cavity 510 and trench 515 with a sacrificial material, such as phosphosilicate glass (PSG), for example, which is subsequently released to leave respective air spaces, as discussed above with reference to FIG. 1. The first and second base contacts 501 and 502, the first and second lid pads 531 and 532, and the first and second vias 537 and 538 may be formed of electrically conductive materials, such as gold (Au), aluminum (Al), copper (Cu), or various combinations thereof, for example. The seal ring 540 may be formed of a dielectric and/or insulating material, or a conductor material, such as gold, for example.

As mentioned above, the different materials forming the components in the packaged IC circuit 500 generally have different temperature expansion and contraction characteristics, respectively. According, the materials tend to expand and contract at different rates in response to changes in temperature, including changes in external ambient temperature and/or changes in internal operating temperature. For example, the metal material of the first and second base contacts 501 and 502 expand and contract more quickly in response to increasing and decreasing temperatures, respectively, than the base substrate 505. This differential in temperature expansion and contraction characteristics causes bending or warping of the substrate 505 (typically the more pliant material), resulting in application of mechanical pressure on the substrate 505 and ultimately stress on the acoustic resonator 120, as discussed above. Therefore, the trench 515 (or portions of the trench 515) is formed in the substrate 505 between each of the first and second base contacts 501 and 502, respectively, and an outer perimeter of the acoustic stack of the acoustic resonator 120. This placement of the trench 515 enables the substrate 505 to flex a certain amount (as generally determined by the depth of the trench 115, the types of materials involved and the extent of the temperature change, thereby reducing mechanical stress incurred by the acoustic resonator 120, including the piezoelectric layer 124, and thus stabilizing the resonance frequency.

Figure 6:
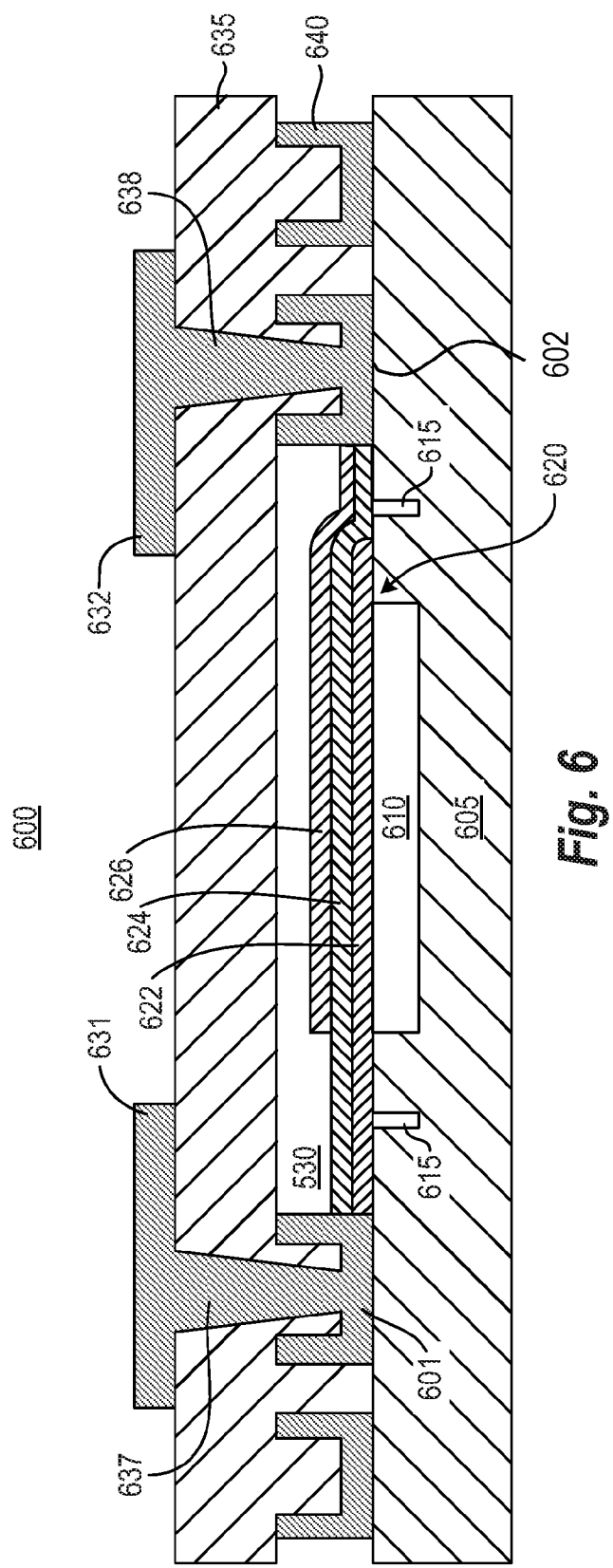
FIG. 6 is a cross-sectional view of an IC device including an acoustic resonator device having at least trench in a base substrate, according to a representative embodiment.

In the preceding embodiments, at least one trench has been formed in the substrate 105, 505 outside an outer perimeter of the acoustic resonator 120. In alternative embodiments, however, the at least one trench may be formed within the outer perimeter of the acoustic resonator 120, that is, beneath the acoustic resonator 120 or at least portions of the acoustic resonator 120 (such as a bottom electrode layer and/or a piezoelectric layer extending beyond the acoustic stack. FIG. 6 is a cross-sectional view of an acoustic resonator having a trench in a substrate within the outer perimeter of an acoustic resonator (integrated in an IC device, according to a representative embodiment.

Referring to FIG. 6, packaged IC circuit 600 includes acoustic resonator 620 formed on a base substrate 605, which defines a cavity 610 (e.g., air cavity) enabling acoustic reflection, assembled using flip-chip technology, for example. The acoustic resonator 620 includes a bottom electrode layer 622 formed on the substrate 605 over the cavity 610, a piezoelectric layer 624 formed on the substrate 605 and the bottom electrode layer 622, and a top electrode layer 626 formed on the piezoelectric layer 624. Overlapping portions of the bottom electrode layer 622, the piezoelectric layer 624 and the top electrode layer 626 form an acoustic stack and otherwise define an active area of the acoustic resonator device 620.

In addition, trench 615 is formed in the substrate 605 beneath the acoustic resonator 620, within an outer perimeter of the acoustic resonator 620, beyond the acoustic stack in which the active area of the acoustic resonator 620 is defined. In the depicted embodiment, trench 615 is substantially the same depth as the cavity 610, although in various alternative embodiments, the trench 615 may extend deeper or shallower into the substrate 605, or may be wider or narrower, as discussed above with reference to FIGS. 2 to 4, without departing from the scope of the present teachings. Also, it is assumed for purposes of illustration that the trench 615 is a single trench forming a continuous loop (around the cavity 610) within the outer perimeter of the acoustic resonator 620. However, in alternative embodiments, the trench 615 may comprise one or more trench portions that curve around only portions of the cavity 610, forming only a partial loop, or that extend in a straight line, e.g., in a direction perpendicular to the cross-sectional face of the packaged IC circuit 600, as discussed above with reference to FIG. 1.

The packaged IC circuit 600 further includes a lid substrate 635 positioned over the acoustic resonator 620 and defining a lid cavity 630 between the base substrate 605 and the lid substrate 635. The acoustic resonator 620 is positioned within the lid cavity 630. The lid substrate 635 is connected and sealed to the base substrate 605 by seal ring 640 formed between the lid substrate 635 and the base substrate 605 around an outer perimeter of the packaged IC circuit 600. The seal ring 640 forms an outer boundary of the lid cavity 630.

Circuitry of the base substrate 605, including the acoustic resonator 620, is electronically connected to circuitry of the lid substrate 635. That is, in the depicted embodiment, a first base contact 601 is disposed on the base substrate 605 and electrically connected to the bottom electrode 622 of the acoustic resonator 620, and a second base contact 602 is disposed on the base substrate 605 and electrically connected to the top electrode 626 of the acoustic resonator 620. Application of voltage across the bottom and top electrode layers 622 and 626 via the first and second base pads 601 causes the piezoelectric layer 624 to oscillate at a corresponding resonance frequency, as discussed above.

Also in the depicted embodiment, circuitry of the lid substrate 635 includes first lid pad 631 and second lid pad 632 disposed on the lid substrate 635. The first lid pad 631 may be electrically connected to the first base contact 601 through first via 637, and the second lid pad 632 may be electrically connected to the second base contact 602 through second via 638.

Generally, the illustrative materials and dimensions of the various components described with reference to FIG. 6 may be substantially the same as the corresponding components described above with reference to FIGS. 1-5. Therefore, these descriptions will not be repeated for the sake of brevity.

As mentioned above, the different materials forming the components in the packaged IC circuit 600 generally have different temperature expansion and contraction characteristics, respectively. According, the materials tend to expand and contract at different rates in response to changes in temperature, including changes in external ambient temperature and/or changes in internal operating temperature. For example, the metal material of the first and second base contacts 601 and 602 expand and contract more quickly in response to increasing and decreasing temperatures, respectively, than the base substrate 605. This differential in temperature expansion and contraction characteristics causes bending or warping of the substrate 605, resulting in application of mechanical pressure on the substrate 605 and ultimately stress on the acoustic resonator 620, as discussed above. Therefore, the trench 615 (or portions of the trench 615) is formed in the substrate 605 between each of the first and second base contacts 601 and 602, respectively, and an outer perimeter of the acoustic stack of the acoustic resonator 620. This placement of the trench 615 enables the substrate 605 to flex a certain amount (as generally determined by the depth of the trench 615, the types of materials involved and the extent of the temperature change, thereby reducing mechanical stress incurred by the acoustic resonator 620, including the piezoelectric layer 624, and thus stabilizing the resonance frequency.

Figure 7:
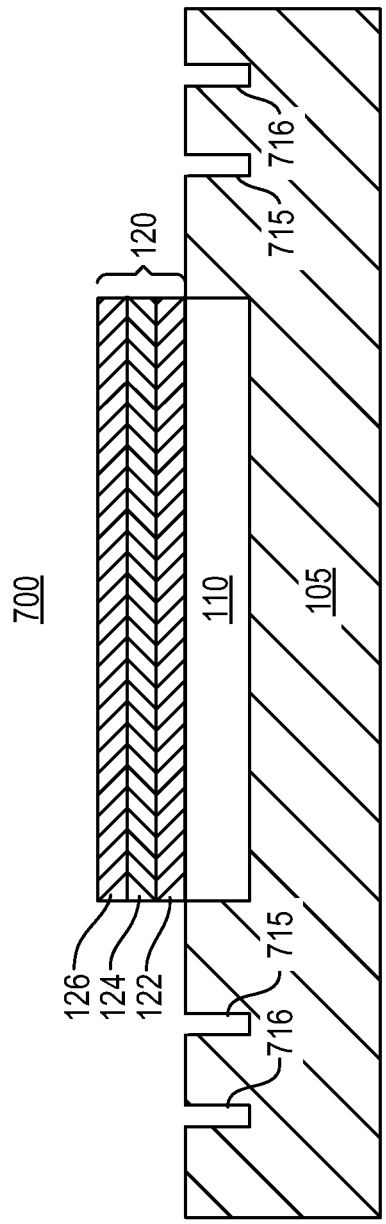
FIG. 7 is a cross-sectional view of an acoustic resonator device having multiple trenches in a substrate, according to a representative embodiment.
Figure 8:
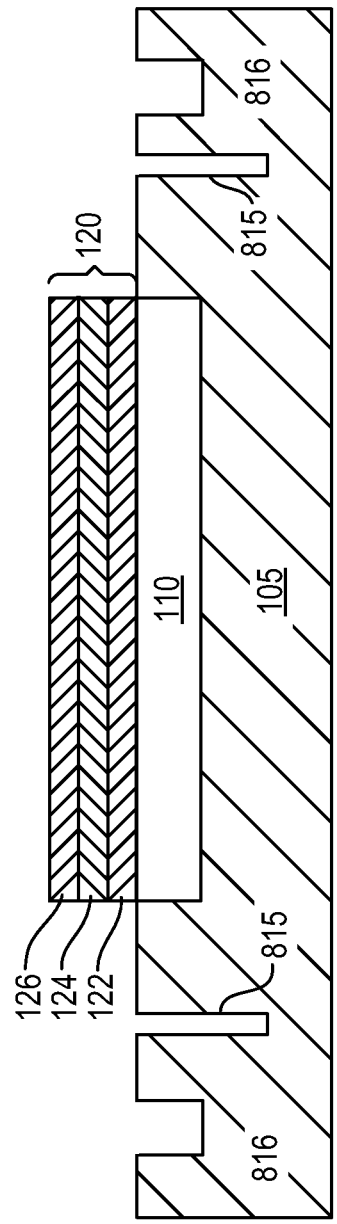
FIG. 8 is a cross-sectional view of an acoustic resonator device having multiple trenches in a substrate, according to a representative embodiment.

FIG. 7 and FIG. 8 are cross-sectional views of acoustic resonator devices having multiple trenches in a substrate, according to representative embodiments. These acoustic resonator devices may likewise be incorporated into packaged IC circuits, as discussed above with reference to FIGS. 5 and 6.

Referring to FIG. 7, acoustic resonator device 700 is substantially the same as the acoustic resonator device 100 shown in FIG. 1, except that multiple trenches, first and second trenches 715 and 716, are formed in the substrate 105. That is, the acoustic resonator device 700 includes the substrate 105, the cavity 110, and the acoustic resonator 120 formed on the substrate 105 over the cavity 110. The first trench 715 (inner trench) is formed outside an outer perimeter of the acoustic resonator 120 and the second trench 716 (outer trench) is formed outside an outer perimeter of the first trench 715. In the depicted embodiment, the first and second trenches 715 and 716 are substantially the same depth as the cavity 110, although in various alternative embodiments, one or both of the first and second trenches 715 and 716 may extend deeper or shallower into the substrate 105 than the cavity 110 and/or than one another, and may be or may be wider or narrower than one another, as discussed below with reference to FIG. 8, without departing from the scope of the present teachings.

Also, it is assumed for purposes of illustration that each of the first trench 715 and the second trench 716 is a single trench, which form concentric continuous loops (around the cavity 110) outside the outer perimeter of the acoustic resonator 120. However, in alternative embodiments, one or both of the first trench 715 and the second trench 716 may comprise one or more trench portions that curve around only portions of the cavity 110, forming only a partial loop, or that extend in a straight line, e.g., in a direction perpendicular to the cross-sectional face of the acoustic resonator device 700, as discussed above with reference to FIG. 1. In addition, in alternative embodiments, one or both of the first trench 715 and the second trench 716 may be located within the outer perimeter of the acoustic resonator 120, as discussed above with reference to FIG. 6, without departing from the scope of the present teachings.

The first and second trenches 715 and 716 generally provide somewhat more flexibility to the substrate 105 and correspondingly less stress to the acoustic resonator 120, in response application of mechanical pressure tending to flex the substrate 105, since they constitute multiple stress release locations. However, as in the case of a deeper trench (e.g., trench 215), the substrate 105 may be less structurally sound due to the removal of a larger amount of material from the substrate 105 when etching two trenches (e.g., first and second trenches 715 and 716) as opposed to one trench (e.g., trench 115 or trench 615). Of course, the number of trenches (e.g., more than two), the depth and/or width of each of the first and second trenches 715 and 716, as well as relative proximities to the acoustic resonator 120 and/or to one another, may vary to provide unique benefits for any particular situation or to meet application specific design requirements of various implementations, without departing from the scope of the present teachings.

For example, referring to FIG. 8, acoustic resonator device 800 is substantially the same as the acoustic resonator device 700 shown in FIG. 7, except that the multiple trenches, first and second trenches 815 and 816, formed in the substrate 105 have different lengths and widths than one another. That is, the acoustic resonator device 800 includes the substrate 105, the cavity 110, and the acoustic resonator 120 formed on the substrate 105 over the cavity 110. The first trench 815 (inner trench) is formed outside an outer perimeter of the acoustic resonator 120 and the second trench 816 (outer trench) is formed outside an outer perimeter of the first trench 815. In the depicted embodiment, the first trench 815 is longer (extending further into the substrate 105) and wider than the second trench 816, although in various alternative embodiments, the relative lengths and widths of the first and second trenches 815 and 816 may vary, without departing from the scope of the present teachings. For example, the first and second trenches 815 and 816 may have equal widths and different depths, or the first and second trenches 815 and 816 may have equal depths and different depths.

Also, it is assumed for purposes of illustration that each of the first and second trenches 815 and 816 is a single trench, which form concentric continuous loops (around the cavity 110) outside the outer perimeter of the acoustic resonator 120. However, in alternative embodiments, one or both of the first trench 815 and the second trench 816 may comprise one or more trench portions that curve around only portions of the cavity 110, forming only a partial loop, or that extend in a straight line, e.g., in a direction perpendicular to the cross-sectional face of the acoustic resonator device 800, as discussed above with reference to FIG. 1. In addition, in alternative embodiments, one or both of the first trench 815 and the second trench 816 may be located within the outer perimeter of the acoustic resonator 120, as discussed above with reference to FIG. 6, without departing from the scope of the present teachings.

The first and second trenches 815 and 816 generally provide somewhat more flexibility to the substrate 105 and correspondingly less stress to the acoustic resonator 120, in response application of mechanical pressure tending to flex the substrate 105, since they constitute multiple stress release locations. However, as discussed above, the substrate 105 may be less structurally sound due to the removal of a larger amount of material from the substrate 105 when etching multiple trenches.

Notably, for simplicity of explanation, FIGS. 1-4 and 7-8 show a single die for providing acoustic resonator devices 100-400 and 700-800. It is understood, however, that fabrication steps may be performed simultaneously on multiple dies in wafer form, such that corresponding acoustic resonators devices (e.g., each of which would be the same as one of the acoustic resonator devices 100-400 or 700-800, for example) may be formed during the fabrication process and separated (or singulated) upon completion, as would be apparent to one of ordinary skill in the art.

Figure 9:
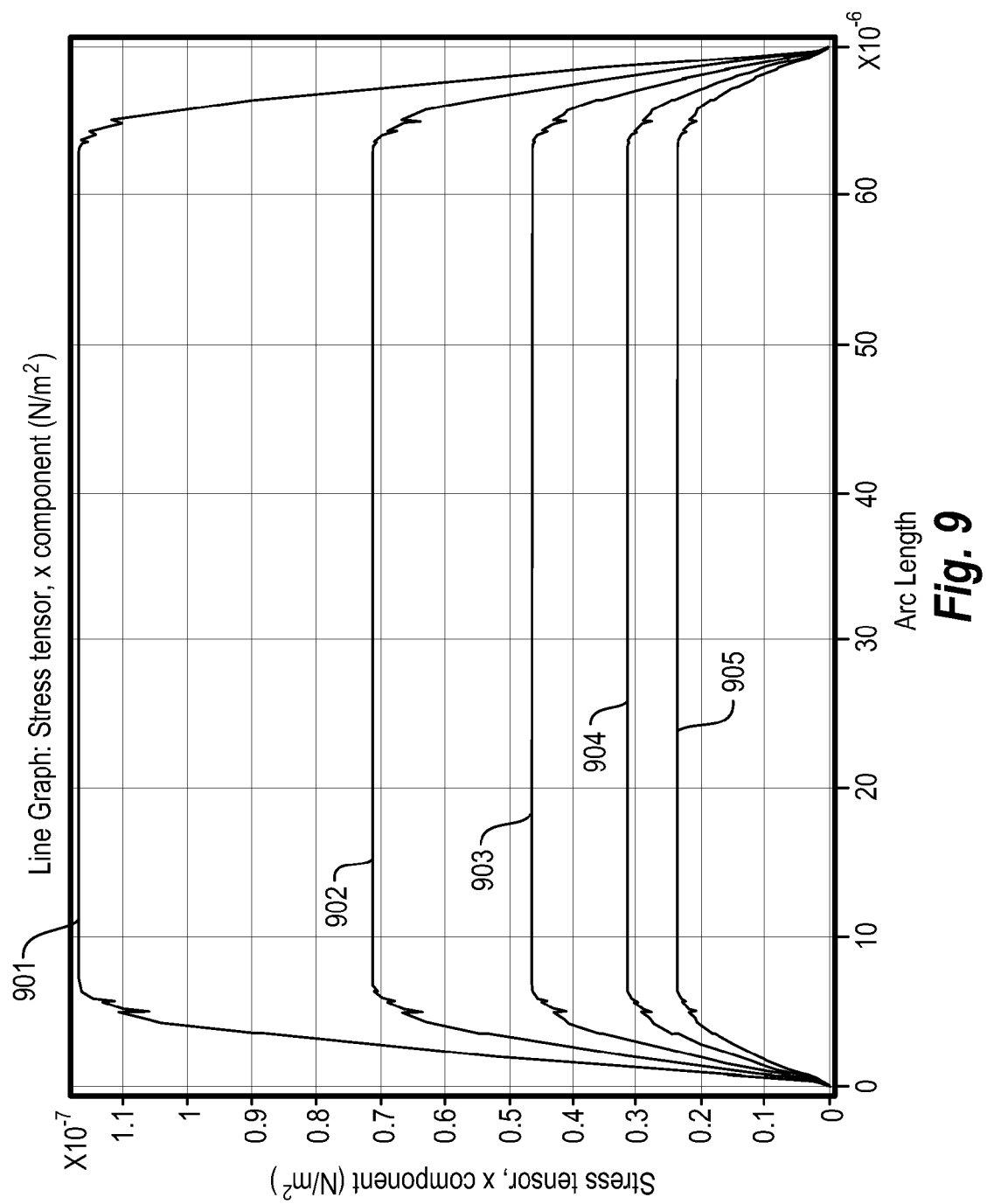
FIG. 9 is a comparative graph showing stress tensor responsive to different trench depths in a substrate of an acoustic resonator device, according to representative embodiments.

FIG. 9 is a comparative graph showing stress tensor responsive to different trench depths in a substrate of an acoustic resonator device, according to representative embodiments.

Referring to FIG. 9, the vertical axis depicts stress tensor (x component) in $N/m^2$ of stress incurred by an acoustic resonator (e.g., acoustic resonator 120) including a piezoelectric layer (e.g., piezoelectric layer) as a result of force applied to the substrate (e.g., substrate 105). The horizontal axis depicts the arc length in micrometers, which corresponds to the amount of bending experienced by the substrate in response to the application of force.

Curves 901 to 905 in FIG. 9 correspond to different depths of trenches (e.g., trenches 115, 215, 315), and having the same widths, formed in the substrate around the acoustic resonator. In particular, curve 901 corresponds to a trench extending about 5 μm into the substrate, curve 902 corresponds to a trench extending about 10 μm into the substrate, curve 903 corresponds to a trench extending about 15 μm into the substrate, curve 904 corresponds to a trench extending about 20 μm into the substrate, and curve 905 corresponds to a trench extending of about 25 μm into the substrate. In each configuration, the depth of the cavity (e.g., cavity 110) is approximately 15 μm, for purposed of illustration.

As shown in FIG. 9, the further the trench extends into the substrate, the lower the stress experienced by the piezoelectric component (the acoustic resonator and associated piezoelectric layer). For example, the lowest stress is indicated by curve 905 (corresponding to a 25 μm trench), which results in maximum stress tensor of about $0.24 \times 10^7$ N/m2, and the highest stress is indicated by curve 901 (corresponding to the 5 μm trench), which results in maximum stress tensor of about $1.19 \times 10^7$ N/m2. This general reduction in stress in response to longer trenches applies to other embodiments, examples of which are discussed above, which include different numbers and locations of trenches.

In various embodiments, the widths, depths, thicknesses and/or materials of the various elements and layers may vary to provide unique benefits for any particular situation or to meet application specific design requirements of various implementations, as would be apparent to one skilled in the art.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A microelectronic device, comprising:
a base substrate having a first cavity and at least one trench respectively extending into the base substrate from a top surface of the base substrate, the at least one trench being physically separated along the top surface of the base substrate from the first cavity;
a lid substrate positioned over the base substrate, the lid substrate defining a second cavity over the first cavity and the at least one trench in the base substrate; and
an acoustic resonator, including piezoelectric material, disposed over the first cavity of the base substrate and positioned within the second cavity, the acoustic resonator having a corresponding resonance frequency,
wherein a bottom of the at least one trench is displaced away from a bottom surface of the base substrate, and a top of the at least one trench is within an outer perimeter of the second cavity, and
wherein the at least one trench is positioned such that the at least one trench expands at the top surface of the base substrate in response to a downward flexing of the base substrate, and contracts at the top surface of the base substrate in response to an upward flexing of the base substrate so as to reduce mechanical stress on the acoustic resonator, for stabilizing the resonance frequency.

2. The device of claim 1, wherein the at least one trench is formed between an outer perimeter of the first cavity and the outer perimeter of the second cavity, and is physically separated from the outer perimeter of the second cavity along the top surface of the base substrate.

3. The device of claim 2, wherein the at least one trench comprises a continuous loop around the acoustic resonator.

4. The device of claim 1, wherein the acoustic resonator comprises a bottom electrode extending over the first cavity on the top surface of the base substrate, and wherein at least a portion of the at least one trench is below the bottom electrode.

5. The device of claim 1, wherein a trench depth of the at least one trench is substantially the same as a cavity depth of the first cavity.

6. The device of claim 1, wherein a trench depth of the at least one trench is greater than a cavity depth of the first cavity.

7. The device of claim 1, wherein a trench depth of the at least one trench is less than a cavity depth of the first cavity.

8. The device of claim 1, wherein the acoustic resonator comprises one of a bulk acoustic wave (BAW) resonator and a surface acoustic wave (SAW) resonator.

9. The device of claim 1, wherein the at least one trench comprises:
an inner trench formed outside an outer perimeter of the first cavity; and
an outer trench formed outside an outer perimeter of the inner trench.

10. The device of claim 1, wherein the at least one trench is positioned in the base substrate such that a trench depth of the at least one trench is inversely proportional to an amount of a tensile stress incurred by the acoustic resonator in response to a downward flexing force applied to the base substrate.

11. The device of claim 1, wherein the at least one trench is positioned in the base substrate such that a trench width of the at least one trench is inversely proportional to an amount of compressive stress incurred by the acoustic resonator in response to an upward flexing force applied to the base substrate.

12. The microelectronic device of claim 2, wherein an opening at the top of the at least one trench is in direct communication with an open area defined by the second cavity.

13. The device of claim 1, wherein the at least one trench is disposed between the outer perimeter of the second cavity and an outer perimeter of a top electrode of the acoustic resonator, and is physically separated from the outer perimeter of the second cavity along the top surface of the base substrate.

14. The device of claim 1, wherein the at least one trench is disposed between the outer perimeter of the second cavity and an outer perimeter of a bottom electrode of the acoustic resonator, and is physically separated from the outer perimeter of the second cavity along the top surface of the base substrate.

15. The device of claim 1, wherein the piezoelectric material of the acoustic resonator comprises a piezoelectric layer over the top surface of the base substrate, at least a portion of the at least one trench being disposed below the piezoelectric layer.

16. The device of claim 9, wherein each of the inner trench and the outer trench extend in parallel into the base substrate in a same direction as the first cavity extends into the base substrate.

17. The device of claim 9, wherein the inner trench is disposed between the outer trench and the first cavity, and the outer trench is disposed between the inner trench and the outer perimeter of the second cavity.

18. The device of claim 9, wherein the inner trench and the outer trench are single trench structures, respectively, which form concentric loops around the first cavity.

19. The device of claim 1 further comprising:
a base contact on the top surface of the base substrate, the at least one trench being disposed between the first cavity and the base contact.

20. The device of claim 1, wherein an opening of the at least one trench is uncovered on the top surface of the base substrate, within the second cavity.

21. The device of claim 1, wherein the at least one trench comprises inner sidewalls extending downwardly, below the top surface of the base substrate, the inner sidewalls being exposed to be in direct communication with the second cavity.

22. A bulk acoustic wave (BAW) resonator device, comprising:
a base substrate defining a base cavity and a trench extending partially into the base substrate;
a lid substrate positioned over the base substrate, the lid substrate defining a lid cavity; and
an acoustic resonator formed over the base cavity and positioned within the lid cavity, the acoustic resonator comprising a piezoelectric layer formed between a bottom electrode and a top electrode, and overlapping portions of the bottom electrode, the piezoelectric layer and the top electrode forming an acoustic stack,
wherein the trench is formed in the base substrate within a perimeter of the lid cavity and outside an outer perimeter of the acoustic stack, the trench being physically separated from each of the base cavity and the perimeter of the lid cavity along a top surface of the base substrate, and
wherein the trench is positioned to expand at the top surface of the base substrate in response to a downward flexing of the base substrate, and to contract at the top surface of the base substrate in response to an upward flexing of the base substrate so as to reduce mechanical stress on the acoustic resonator.

23. An integrated circuit (IC) package, comprising:
a base substrate;
an acoustic resonator formed on the base substrate over a base cavity in the base substrate, the base cavity enabling acoustic reflection, the acoustic resonator comprising a piezoelectric layer formed between a bottom electrode and a top electrode, wherein an acoustic stack of the acoustic resonator is defined by overlapping portions of the bottom electrode, the piezoelectric layer and the top electrode;
a lid substrate positioned over the acoustic resonator and defining a lid cavity, in which the acoustic resonator is positioned, the lid cavity being larger than the base cavity;
first and second base contacts disposed on the base substrate and electrically connected to the bottom and top electrodes, respectively, wherein the lid cavity extends between edges of the first and second base contacts; and
a trench formed in the base substrate between the edges of each of the first and second base contacts and an outer perimeter of the base cavity within the lid cavity, the trench being physically separated along a top surface of the base substrate from the base cavity,
wherein the trench expands at the top surface of the base substrate in response to a downward flexing of the base substrate, and contracts at the top surface of the base substrate in response to an upward flexing of the base substrate, so as to reduce mechanical stress on the acoustic resonator otherwise caused by different expansion and contraction characteristics of the first and second base contacts and the base substrate.

24. The IC package of claim 23, further comprising:
first and second lid pads disposed on the lid substrate and electrically connected to the first and second base contacts through first and second vias, respectively,
wherein the trench reduces mechanical stress on the acoustic resonator otherwise caused by forces on the base substrate applied through the first and second lid pads through the first and second vias, respectively.

* * * * *